United States Patent [19]

Kang et al.

[11] Patent Number: 5,140,566
[45] Date of Patent: Aug. 18, 1992

[54] OPTICAL DATA RECORDING AND PLAYBACK SYSTEM

[75] Inventors: Jin-Ku Kang, Seoul; Jong-Kyoung Yoon, Suwon, both of Rep. of Korea

[73] Assignee: SamSung Electronics Co., Ltd., Suweon, Rep. of Korea

[21] Appl. No.: 623,532

[22] Filed: Dec. 7, 1990

[30] Foreign Application Priority Data

Dec. 8, 1989 [KR] Rep. of Korea ............ 1989-18176

[51] Int. Cl.$^5$ ............ G11B 11/00; G11B 5/09; G11B 7/00; G11B 5/02
[52] U.S. Cl. ............ 369/13; 369/44.11; 369/44.18; 369/47; 369/48; 360/59
[58] Field of Search ............ 369/13, 97, 14, 15, 369/44.13, 110, 111, 112, 47, 44.11, 44.12, 44.14, 113; 360/59, 114, 112, 77.05, 77.07; 350/6.1, 6.7; 365/122; 358/206, 208, 312

[56] References Cited

U.S. PATENT DOCUMENTS

| | | | |
|---|---|---|---|
| 4,213,039 | 6/1980 | Schasser | 360/112 |
| 4,253,017 | 2/1981 | Whitehead | 360/112 |
| 4,275,428 | 6/1981 | Lehureau | 360/112 |
| 4,371,905 | 2/1983 | Valstyn et al. | 360/112 |
| 4,379,612 | 4/1983 | Matsuoka | 369/112 |
| 4,399,471 | 8/1983 | Preuss | 369/111 |
| 4,815,067 | 3/1989 | Webster et al. | 369/97 |
| 4,818,046 | 4/1989 | Kondo | 350/6.1 |
| 4,843,481 | 6/1989 | Plummer | 369/111 |
| 4,848,864 | 7/1989 | Ostertag et al. | 350/6.7 |
| 4,901,297 | 2/1980 | Komatsu et al. | 369/13 |
| 4,913,091 | 3/1980 | Kleuters et al. | 369/112 |
| 4,937,808 | 6/1990 | Shimada et al. | 369/112 |
| 4,949,100 | 8/1990 | Hidaka | 369/44.11 |
| 4,970,707 | 11/1990 | Hara et al. | 369/44.11 |

*Primary Examiner*—Stuart S. Levy
*Assistant Examiner*—Tan Nguyen
*Attorney, Agent, or Firm*—Robert E. Bushnell

[57] ABSTRACT

Apparatus is disclosed for providing an optical system which drives beam collecting lens by piezo device, for focusing the beam which moves according to the rotation of reflection mirror for using beam scanning that scans the laser beam on the surface of optical magnetic tape to be always set on the surface of the tape. An optical magnetic recording system modulates an image signal and converts the modulated signal to laser signal, and drives beam collecting lens (object lens) that collects the laser data by the synchronizing signal of the image signal, so as to allow optical magnetic recording on the tape surface. An optical recording system for recording by helical scanning the collected beam of the beam collecting lens on the tape surface using polysurface rotary mirror. An optical recording and playback system picks up optically recorded data on a optical magnetic tape using a contact sensor. A magnetic recording data pick-up device having a Hall sensor array, detects optical recording data on the surface of the optical magnetic tape by approaching the surface thereof, an accumulator and a shift array for accumulating and shifting the signal from the Hall sensor array. A magnetic recording data read control circuit which controls magnetic recording pick-up device by control data recorded according to main data.

22 Claims, 8 Drawing Sheets

OPTICAL DATA RECORDING AND PLAYBACK SYSTEM

BACKGROUND OF THE INVENTION

The present invention relates to an optical recording and playback system using laser light beam to record or erase data on an optical magnetic recording media, and using a contact image sensor to reproduce the data recorded on the recording media. Optical recording and playback devices, which modulate predetermined data into laser light beam, record the modulated light beam on recording media, and reproduce or erase the recorded data, have continued to evolve for long time. The optical recording and playback devices conventionally have an optical system with a plurality of lenses which are commonly formed of glass materials.

In order to record laser light data on recording media using lenses as stated above, the system must include a lens driver which is an automatic focus controller that allows the focus of laser beam to be automatically set in wide range of the recording media. Representative examples of this composition already in practical use are compact disc players and video disc players. However, since the system records data on a given size recording media, in the above method of recording laser light data on discs, it has a disadvantage of limiting amount of data to be recorded.

On the other hand, an optical recording and playback device, an optical system, which does not require focus adjusting and is capable of recording, reproducing and erasing laser light data on an optical magnetic tape has been introduced. An example of this, is described in Japanese patent application serial no. 61-194644 AN OPTICAL RECORDING AND PLAYBACK DEVICE, published on Aug. 29, 1986 by HITACHI company. The optical recording and playback device has a tape guide that is round-end processed so that a surface of the recording tape is in line with focal locus of laser beam to allow focus of a laser beam focus lens and the surface of optical magnetic tape which is a recording media, to be always positioned within focal locus of the laser beam during beam-scanning.

However, since the device using the tape guide to have the focus of incident light beamed from a lens, always set on the surface of the tape, has the tape guide in contact with the optical magnetic tape, it not only damages the surface of the tape but also can cause the data to be contaminated.

And also during playback, the above optical recording and playback device must use Acoust-Optic (A/O) deflector since it picks up data recorded on tape by optical operation.

SUMMARY OF THE INVENTION

It is accordingly an object of this invention to provide an optical system which drives beam collecting lens by piezo device, for focusing the beam which moves according to the rotation of reflection mirror for using beam scanning that scans the laser beam on the surface of optical magnetic tape to be always set on the surface of the tape.

It is another object of this invention to provide an optical magnetic recording system which modulates an image signal and converts the modulated signal to laser signal, and drives beam collecting lens(object lens) that collects the laser data by the synchronizing signal of the image signal, so as to allow optical magnetic recording on the tape surface.

It is still another object of this invention to provide an optical recording system for recording by helical scanning the collected beam of the beam collecting lens on the tape surface using polysurface rotary mirror.

It is a further object of this invention to provide an optical recording and playback system which can pick up optically recorded data on a optical magnetic tape using a contact sensor.

It is another further object of this invention to provide a magnetic recording data pick-up device having a Hall sensor array which detects optical recording data on the surface of the optical magnetic tape by approaching the surface thereof, an accumulator and a shift array for accumulating and shifting the signal from the Hall sensor array.

It is still another further object of this invention to provide a magnetic recording data read control circuit which controls magnetic recording pick-up device by control data recorded according to main data.

According to an aspect of the present invention, an optical data recording system for recording image signals which are converted into optical signals on an optical magnetic tape, includes: a first laser generator for generating laser beams according to picture data of the image signals; a focus control signal generating circuit for generating electric signals for controlling focus according to synchronizing signals from said image signals; and a beam collecting circuit having a collecting lens and an element that vibrates according to said electric signal for controlling focus applied thereto, for vibrating together with said collecting lens according to the vibration of said vibration element, and for focusing said laser beams according to said vibration in order for said laser beam to be focused on said tape after receiving said generated laser beams.

BRIEF DESCRIPTION OF THE DRAWINGS

For a better understanding of the invention and to show how the same may be carried into effect, reference will now be made, by way of example, to the accompanying diagrammatic drawings, in which.

DESCRIPTION OF THE PREFERRED EMBODIMENTS

Figure 1:
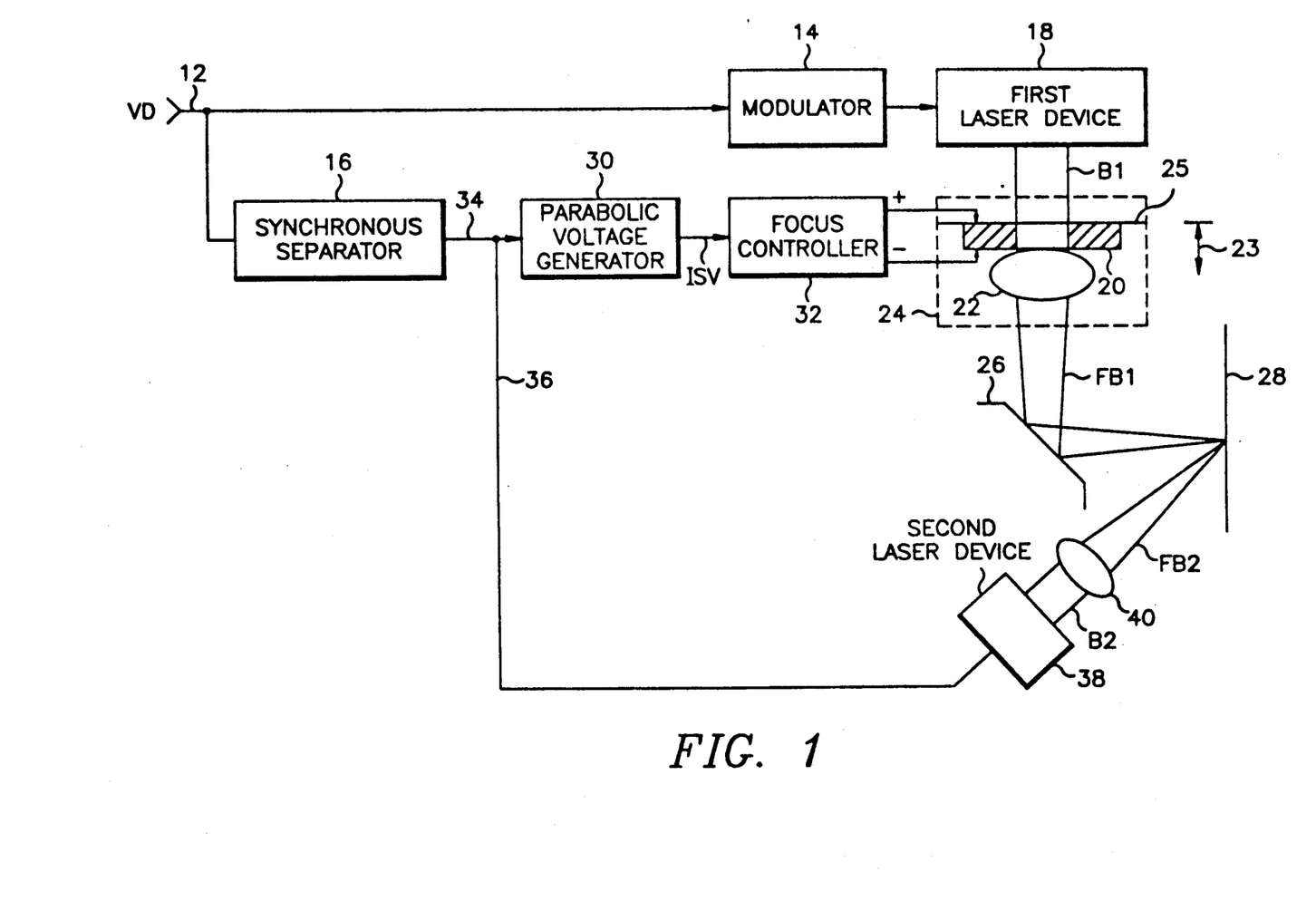
FIG. 1 is a block diagram of an optical data recording system according to the invention.

Referring to FIG. 1, there is described in detail an optical recording system according to the present invention. In the drawing, a modulator 14 converts and modulates composite image signal VD applied to signal line 12 into digital signal. A first laser device 18 coupled to the modulator 14 converts the modulated digital image signal to laser light signal and generates laser data. A collecting module 24 is isolatedly installed perpendicularly to the first laser device 18 to collect output of the laser data and vertically contract or expand according to the input of angle control voltage. A polysurface rotary mirror 26, which has a given number of reflective surface with an angle and only one of these surfaces are installed, to be positioned on the collecting beam output line, diffract and refract the incident beam on the reflective surface according to the rotation of the reflective surface on main track of optical magnetic tape 28 with the incident angle of the beam. A synchronous separator 16 coupled to the signal input line 12 separates synchronizing signal from the image signal VD, and a parabolic voltage generator 30 converts the vertical synchronizing signal from the synchronous separator 16 into parabolic voltage.

A focus controller 32 controls the slope control voltage for controlling the expansion and contraction of the collecting module 24, according to the output from the parabolic voltage generator 30. A second laser device 38 coupled to the output terminal of the synchronous separator 16 converts the vertical synchronizing output to laser beam, and a collecting lens 40 collects the output laser beam of the second laser device 38 onto subtrack of the above optical magnetic tape 28.

The collecting module 24 of FIG. 1 which mounted on fixed support board 25, has 2 poles and an object lens 22 which collects incident beam below piezoelectric element 20 (hereinafter referred to as piezo) which contracts up and down, according to the slope control voltage applied to the 2 poles. They correspond to beam collecting unit. The modulator 14 and the first laser device 18 in FIG. 1 can be in a body constructed as one laser device. Here, the construction of FIG. 1 is a cross sectional view of the collecting module 24, and a hole is formed to allow penetration on the center section of piezo.

And, the method of modulation for the modulator 14 can be both analog and digital modulation method. However, in this invention, explanation is given for digital modulation method. And also, main track is portion where the image signal is recorded on one surface of the optical magnetic tape, and subtrack is portion where the vertical synchronizing signal is recorded as optical data.

Figure 2:
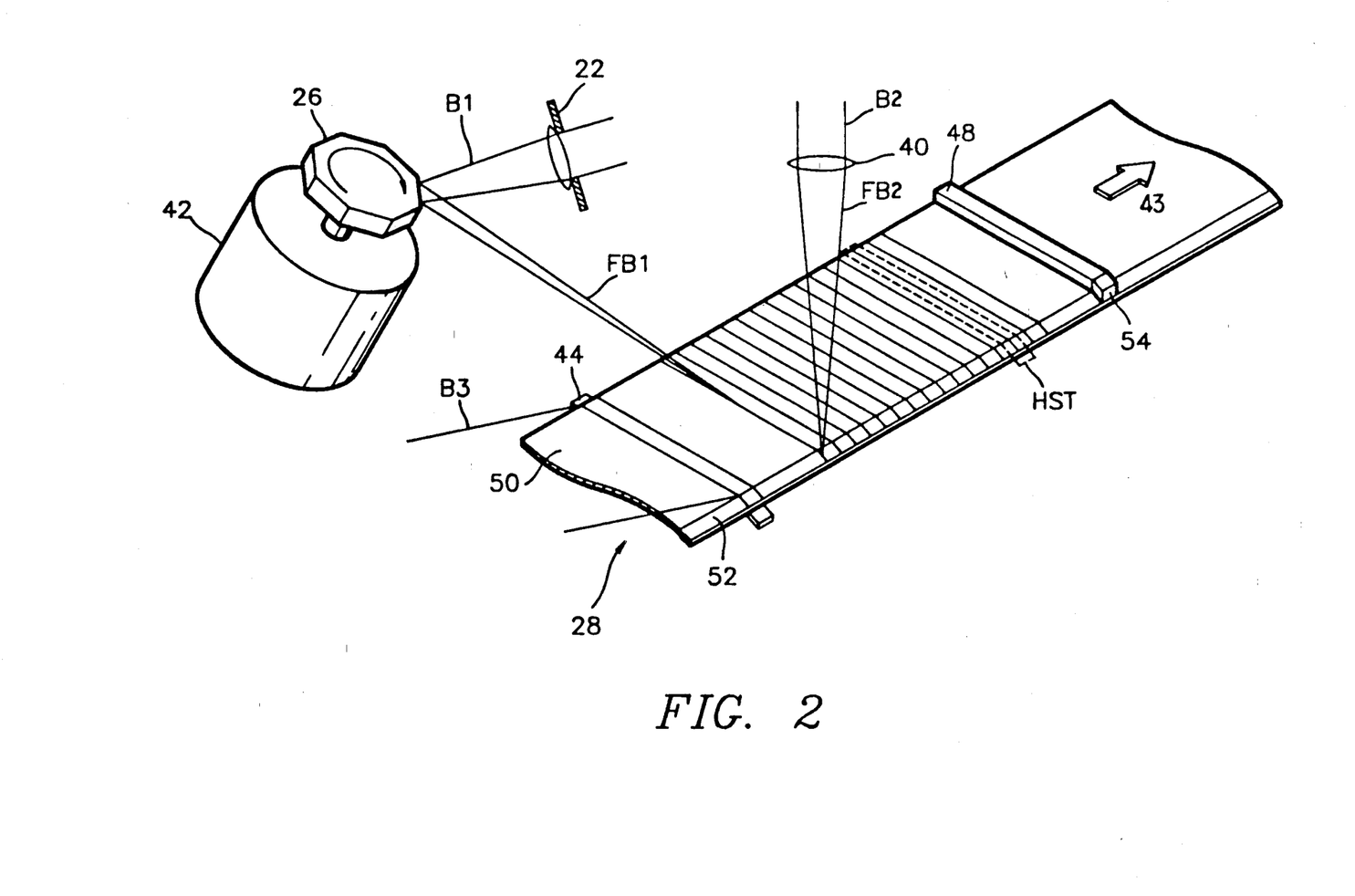
FIG. 2 is a recording and playback scanning state diagram according to the construction of FIG. 1.

Referring to FIG. 2, the reflective surface of the polysurface rotary mirror 26 that is attached to the axis of a polysurface rotary motor 42 is installed at a given rotation angle in the direction 43 so as to helical-scan the beam on the surface of the tape.

The collecting lens 40 is positioned on the surface of the tape so that the beam will be concentrated on the lower portion of the optical magnetic tape 28 which is subtrack.

And a first magnetic field generator 44 which generates magnetic field with N polarity by electric control is installed on the lower surface of the optical magnetic tape 28, and erasure laser beam B3 is beamed on the upper portion of the optical magnetic tape 28 of the first magnetic field generator 44.

And also, pick-up devices 48 and 54 are close installed on the upper portion of the main track 50 and subtrack 52 of the optical magnetic tape in helical scanning angle of the polysurface mirror 26.

Figure 3:
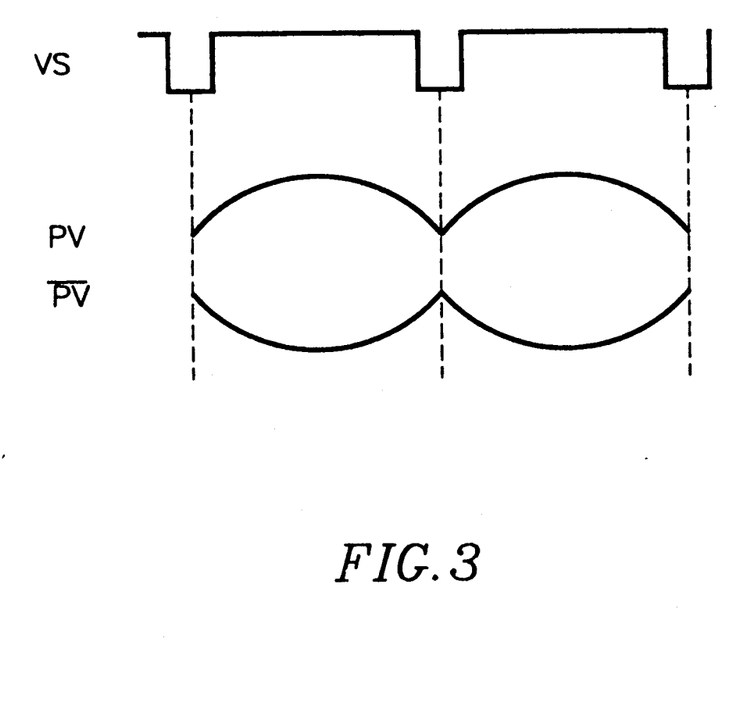
FIG. 3 is a input-output waveforms of focus controller of FIG. 1.

Referring to FIG. 3, is an waveforms of the vertical synchronizing signal VS that is outputted separately from the synchronous separator 16 in FIG. 1 and its conversion signal to parabolic voltage.

Figure 4A:
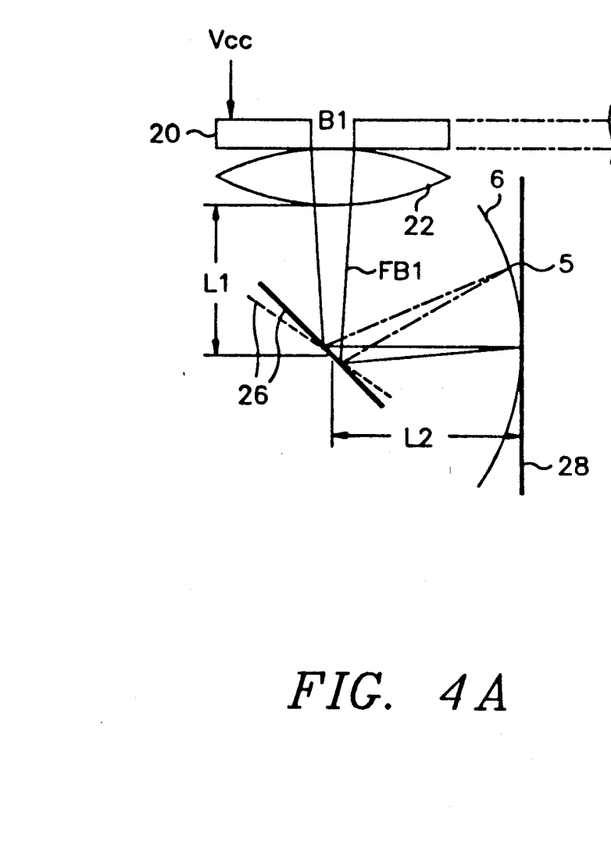
FIGS. 4A and 4B are descriptive drawings of focus change state in connection with change in mirror surface angle of polysurface rotary mirror of FIG. 1.
Figure 4B:
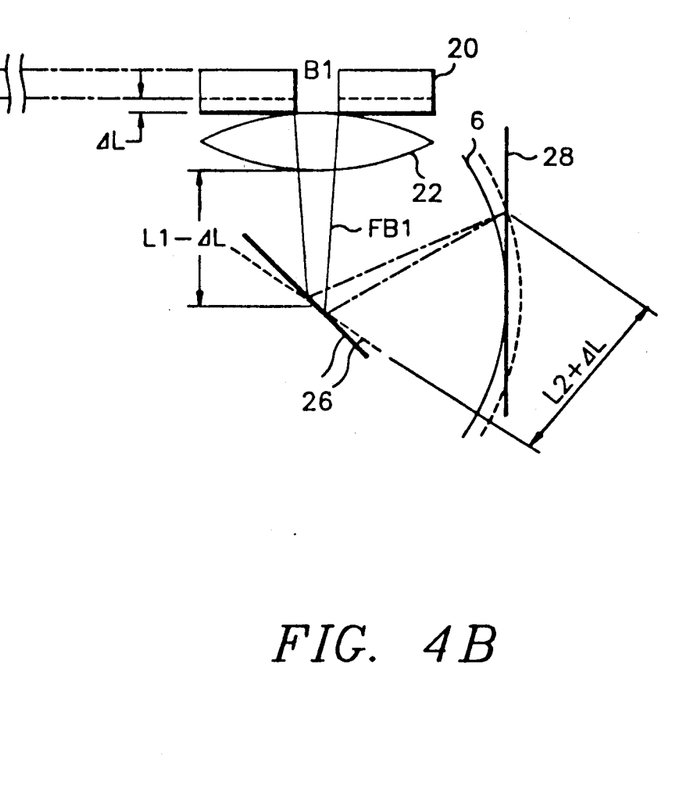

FIGS. 4A and 4B show the focus formation of the collecting beam according to reflection angle of the polysurface mirror 26 as shown in FIGS. 1 and 2, and more particularly, FIG. 4B shows the adjustment of the collected beam according to expansion of piezo 20.

Firstly, recording operation of the invention is described with reference to the above stated FIGS. 1, 4A, and 4B. When a composite image signal VD applies to the signal line 12 in FIG. 1, the modulator 14 modulates the image signal VD into digital signal and applies the modulated digital image signal to the first laser device 18. Here, the synchronous separator 16 separately applies vertical synchronizing signal VS as shown in FIG. 3, to line 34 and 36, after separates the synchronizing signal from the composite image signal VD.

Meanwhile, the first laser device 18 which receives the modulated signal from the modulator 14 beams the laser beam B1 to the collecting lens 22 of the collecting module 24 in correspond to modulated digital data. The incident beam on the collecting lens 22 is collected on a single focus and becomes incident on one of many surfaces of the polysurface rotary mirror 26 as collected beam FB1 which is scanned on the recording surface of the optical magnetic tape 28. Here, the optical magnetic tape 28 is moving at a given speed in the direction of arrow 43 according to the rotation of capstan motor (not shown). And in the above recording mode, a given current is supplied to the first magnetic field generator and magnetic field with N polarity is generated by the first magnetic field generator 44. Therefore, since magnetic field with polarity of N is applied to the lower portion surface of the optical magnetic tape 28, the upper and lower portions of the optical magnetic tape 28 become magnetized to N and S poles respectively.

In the magnetized state as above, when a erasure laser beam B3 (beamed from a laser that is not shown) scans the top surface of the optical magnetic tape 28 which is magnetized to have N polarity, the magnetic field on the surface of the tape is erased.

In the erased state, when the capstan motor continues to rotate, the optical magnetic tape 28 moves in direction 43, and the focus of the polysurface rotary mirror 26 which receives and reflects the collected beam FB1 of the collecting lens 22 is helical scanned and recorded towards the upper portion in a given angle from a side of the optical magnetic tape 28.

In the foregoing example according to the invention, a polysurface rotary mirror has eight reflective surfaces, each of which reflective surfaces is formed to scan one field. In this case, recording helical scanning track HST on the plane of optical magnetic tape can be performed by installing polysurface mirror in order that focus of beams can be moved with a angle against upper surface of the optical magnetic tape 28 that runs flatly.

As described above, the collecting beams FB1 reflected form the polysurface rotary mirror 26 is scanned on the flat surface of the optical magnetic tape 28, thereby a focus of the collected beams FB1 is formed at the focus locus that is apart from the both sides of the optical magnetic tape 28. This will now be described with reference to the FIG. 4A.

When laser beams are beamed to the collecting lens 22, the collecting laser beams are reflected by the polysurface rotary mirror 26 and form an image with focal distance L1+L2 on the surface of the tape. In the above state, when the polysurface mirror 26 is rotated in a given angle to the dotted position of the FIG. 4A, scanning is performed with focal locus of focal distance L1+L2 as shown in 6 of FIG. 4A. Therefore, the focus of the collecting lens 22 is formed at the focal locus with a given distance from the surface of the optical magnetic tape 28 as shown in 6 of the FIG. 4A.

In the present invention, a piezo 20 is mounted on top of the collecting lens 22, thus the operation of the collecting lens 22 is controlled by expansion and contraction of the piezo 20 that occurs in perpendicular direction against the electric field direction according to applied slope control voltage, such operation is described in the following statement.

As described above, when the synchronous separator 16 separates the vertical synchronizing signal VS from the image signal, which is applied to the signal line 12 and applied to the first laser device is being recorded by helical scanning from the lower surface of the optical magnetic tape, the parabolic voltage generator 30 applies the parabolic voltage PV, as shown in the FIG. 3, to focus controller 32 based on the vertical synchronizing signal VS.

The focus controller 32, which is applied the parabolic voltage PV from the parabolic voltage generator 30 as shown in FIG. 3, inverts and amplifies the parabolic voltage PV, and then applies the inverted parabolic voltage PV to positive and negative electrodes of the piezo 20 in the collecting module 24. In this case, when the voltage is applied to the electrodes of the piezo 20, lower part of the support 22 is extended (or contracted) by a length of $_\Delta L$ in the direction of electric field (an arrow 23 of the FIG. 1) caused by the applied voltage. The length $_\Delta L$, which is the length of the piezo 20 extended in the vertical direction 23, varies according to the voltages applied the positive and the negative electrodes.

As stated above, when the piezo 20 is extended by $_\Delta L$ in the vertical direction 23 according to the applied parabolic voltage, the distance L1 which is a distance of collected beams FB1 between the collecting lens 22 and the polysurface mirror 26, is contracted by the distance of $_\Delta L$, and the distance L2 which is a distance of collected beams FB3 between the polysurface mirror 26 and the optical magnetic tape 28, is extended by the given distance of $_\Delta L$. Accordingly, when the piezo 20 is extended and contracted according to reverse parabolic voltage PV based on the vertical synchronizing signal VS, the focus locus according to the rotation angle of the polysurface mirror 26 changes so that focusing across the flat surface of the optical magnetic tape 28 can be realized.

On the other hand, the second laser device 38 receives vertical synchronizing signal VS from the synchronous separator 16, through the line 36, and converts the vertical synchronizing signal VS into laser beam B2, and then applies the laser beam B2 to the collecting lens 40 during the duration of vertical synchronizing pulse. The collecting lens 40 is a fixed lens for focusing the laser beam B2 from the second laser device 38 on subtrack 52 in the optical magnetic tape 28, and performs optical recording to be used as control data during playback.

Therefore, by the construction as shown in the FIGS. 1 and 2 according to the present invention, optical data is recorded by helical scan in response to rotation of the polysurface rotary mirror 26 on the main track 50 in the flat surface of the optical magnetic tape 28, and control data is recorded on the subtrack 52 to control pick-up operation during playback.

In the foregoing description of the invention a polysurface rotary mirror was taken as an example, however, optical recording can be executed on the surface of the optical magnetic tape 28 vertically upward and downward, by placing the optical magnetic tape 28 below the collecting 22 and horizontally moving the laser beams from the first laser device 18.

Figure 5:
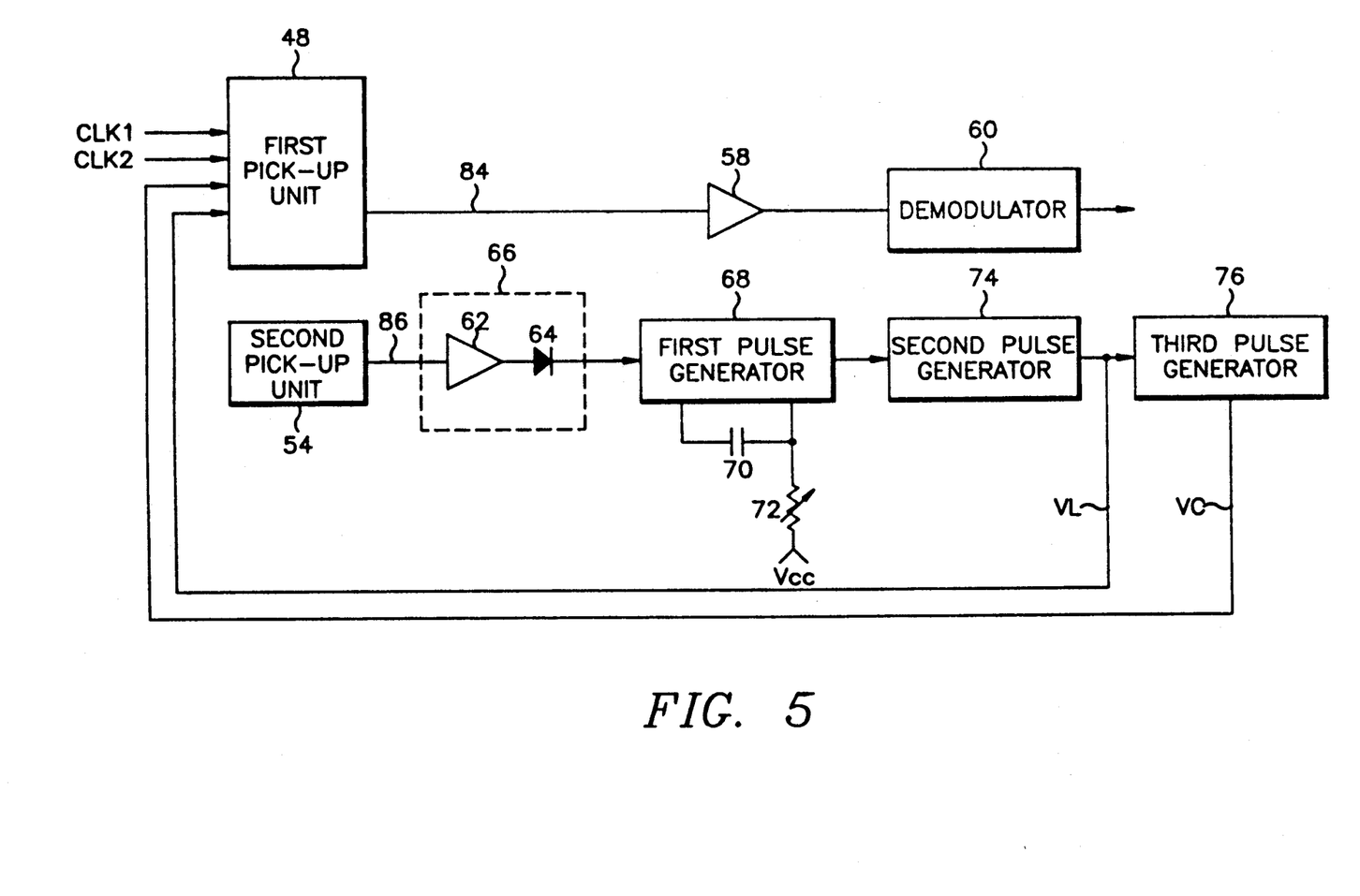
FIG. 5 is a block diagram of optical data reproducing system according to the invention.

Referring to FIG. 5, a pick-up device 48 (referred to as a first pick-up unit) which is disposed close to the flat surface of the optical magnetic tape 28 with a helical scanning angle during playback, senses and stores optical recording data of the helical scanning track (field track) in the main track of the optical magnetic tape 28, shifts and transmits the stored data by charge transmission clock and shift clock. And, a pick-up device 54 (referred to as a second pick-up unit) which is disposed close to the flat surface of the optical magnetic tape 28, senses control data in the subtrack. An amplifying and clipping unit 66 amplifies and clips the output of the second pick-up unit 54. A first pulse generator 68 is triggered at output of the amplifying and clipping unit 66 and generates a first pulse 120 having a first duration T1. A second pulse generator 74 is triggered at a downward edge of the first pulse 120 and applies charge transmission clock VL having a second duration T2, as shown in 130 of FIG. 7A, to the first pick-up unit 48. A third pulse generator 76 is triggered at the output of the second pulse generator 74 and applies clear clock VC having a third duration T3, as shown in 140 of FIG. 7A, to the first pick-up unit 48. An amplifier 58 amplifies the output of the first pick-up unit 48 and a demodulator 60 coupled to an output terminal of the amplifier 58, generates digital image signal by means of conversion and demodulation.

Figure 6:
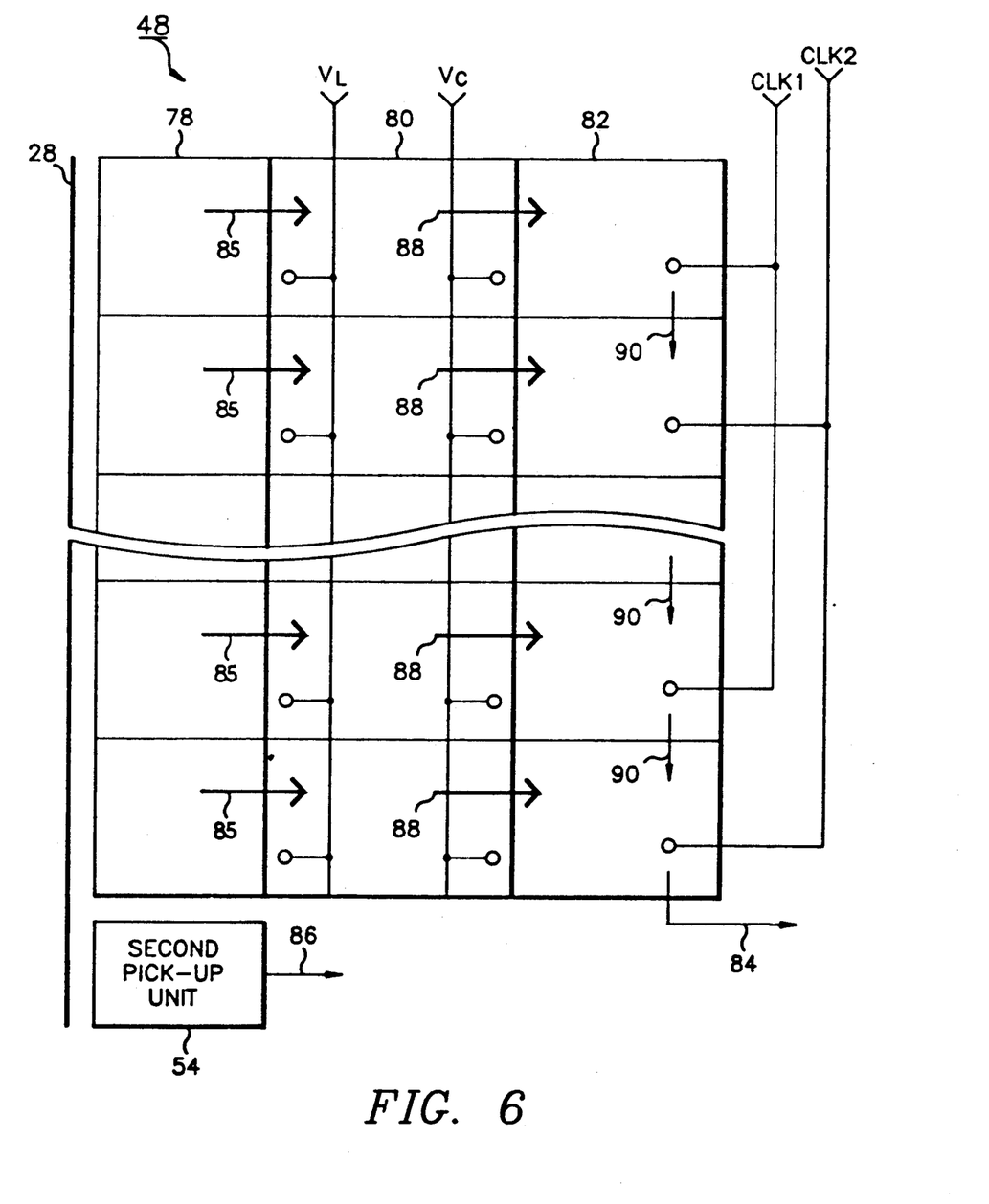
FIG. 6 is a structural diagram of pick-up device according to the invention.

Referring to FIG. 6, the first and second pick-up devices 48 and 54 are disposed close to the surface of the optical magnetic tape 28, by distance of several micro-meters to several tens of micro-meters. The first pick-up unit 48 has a Hall sensor array 78 which is disposed close to the surface of the optical magnetic tape for sensing optical magnetic data recorded on the surface of the optical magnetic tape 28, a line CCD array 80 which is disposed to the Hall sensor array 78 for storing the sensing signal of the Hall sensor array 78, for transmitting the stored data by means of the charge transmission clock VL, and for clearing the stored charge by means of the clear clock VC, and a shift array 82 which shifts signal from the line CCD array 80 by means of the first and second shift clocks CLK1, CLK2. For the second pick-up unit 54, just being such a Hall sensor that can detect magnetic force is sufficient.

Figure 7A:
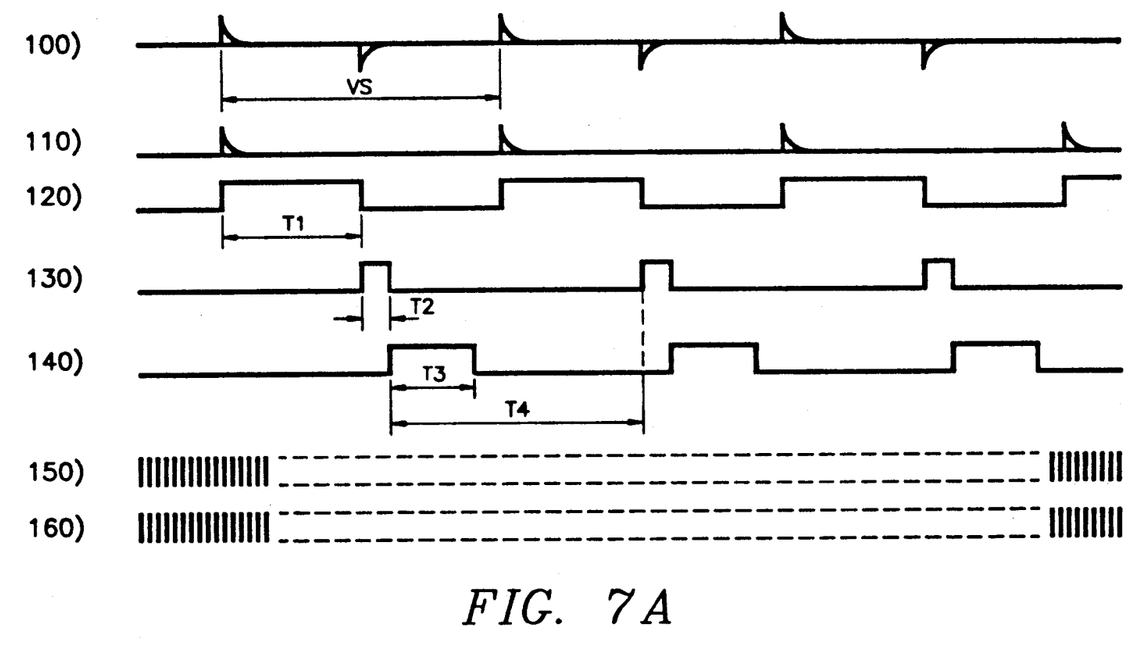
FIGS. 7A and 7B are operation waveforms of a portion of FIG. 5.
Figure 7B:
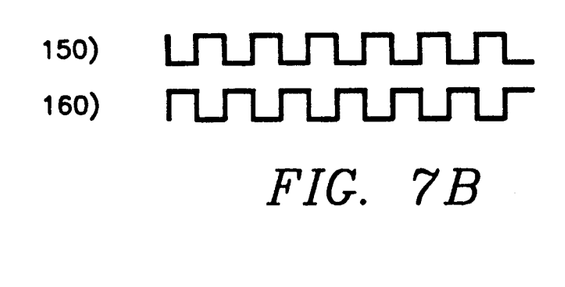

FIG. 7A is operation waveforms of a portion of FIG. 5 and FIG. 7B is an enlarged view of the first and second shift clocks of FIG. 7A. Now, a playback operation is explained with reference to FIGS. 5 and 6, FIGS. 7A and 7B and FIG. 2.

When the present system mode is operated in a playback mode which picks up and playbacks the optical magnetic recorded signal on the optical magnetic tape 28, current applied to the first magnetic field generator 44 of the FIG. 2 is cut off and laser beam B3 does not beam. And of course, the the recording circuit of FIG. 1 does not operate in this case. When the capstan motor rotates by the playback operation and the optical magnetic tape 28 of FIG. 2 forwards in the arrow direction 43, helical scanning track HST recorded by helical scanning passes lower portions of the fixed first and second pick-up devices 48, 54 as described above.

In this case, since data which is recorded on the main track 50 and subtrack 52 within the helical scanning track HST of the optical magnetic tape, is optical magnetic recording data, a magnetic field according to the data is formed. The above-formed magnetic field of the main track 50 and subtrack 52 within the helical scanning track HST is sensed (picked up) by the Hall sensor array 78 of the first and the second pick-up units 48 and 54. The signals sensed by each Hall sensors of the Hall sensor array 78 are transferred to the line CCD array 80 in an arrow direction 85 and stored in each CCD cell of the line CCD array 80 as shown in FIG. 6.

On the other hand, the signal sensed by the second pick-up unit 54, that is, control data (vertical synchronizing signal) contained in the subtrack 52 of the optical magnetic tape 28, is applied to the amplifier 62 through the line 86 to be amplified as a signal identical to 100 of FIG. 7A. The negative signal component is clipped off the diode 64 and only positive signal component identical to 110 of FIG. 7A is supplied to the first pulse generator 68. In this case, the first pulse generator 68 generates the first pulse 120 of FIG. 7A, which has duration T1 according to RC time constant of the capacitor 70 and the resistor 72 and triggers the second pulse 130 of FIG. 7A at the downward edge of the first pulse 120. The first pulse 120 from the first pulse generator 68 is for controlling a time that is required to transfer charge stored in the line CCD array 80 to the shift array 82 and duration T1 of the first pulse 120 can be varied by controlling the resistor 72.

The second pulse generator 74 applies the charge transmission clock VL having the second duration T2 as shown in 130 of FIG. 7 according to an internal RC time constant, to each CCD cells of the line CCD array 80 and simultaneously to the third pulse generator 76 as a trigger pulse. Each CCD cells of the line CCD array 80 transmit the stored charge to the shift-. array 82 that is coupled to the each CCD cells, in direction an arrow 88 as shown in FIG. 6. The signal from the line CCD array 80 is stored in the each CCD cells of the shift array. The shift array 82, wherein signal transmitted from the line CCD array is stored, has a period two to four times longer than a period of the modulated frequencies of the modulator 14 in FIG. 1 and, performs horizontal shift in direction an arrow 90 of FIG. 6 during the duration of T4 as shown in 140 of FIG. 7A according to the first clock CLK1 and second clock CLK2 as shown in 150, 160 of FIG. 7A. Therefore, pick-up signal from the shift array 82 is serially applied to the output line 84.

The pick-up data of the output line 84 is amplified through the amplifier 58 and applied to the demodulator 60. The demodulator 60 demodulates the amplified pick-up data. On the other hand, the third pulse generator 76 applies the clear clock VC having a duration T3 as shown in 140 of FIG. 7A to the each CCD cells of the line CCD array 80 to be stored therein and passes the charge to the ground. Thereby, in the line CCD array 80 as shown in 140 of FIG. 7A next sensing data of the helical scanning track can be stored according to the clear clock VC as shown in 140 of FIG. 7A. Hence, the data recorded on the optical magnetic tape is picked up and generated by the Hall sensor with the helical scanning angle disposed on the helical scanning track HST in the surface of the optical magnetic tape 28.

Figure 8:
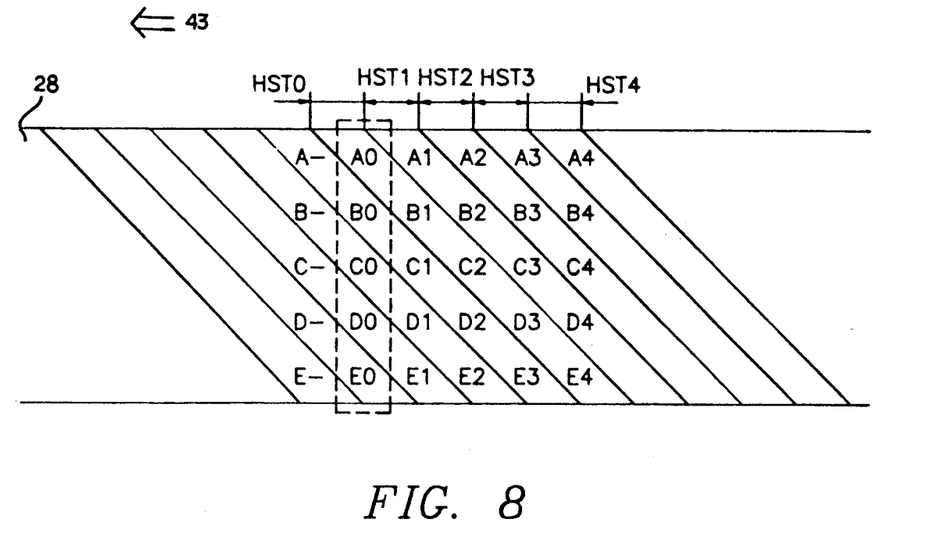
FIG. 8 is a pick-up state diagram of another embodiment according to the invention.

Referring to FIG. 8, the first pick-up unit 48 with the Hall sensor array 78 attached thereto is disposed close vertically to the surface of the optical magnetic tape 28 recorded by helical scanning.

Figure 9:
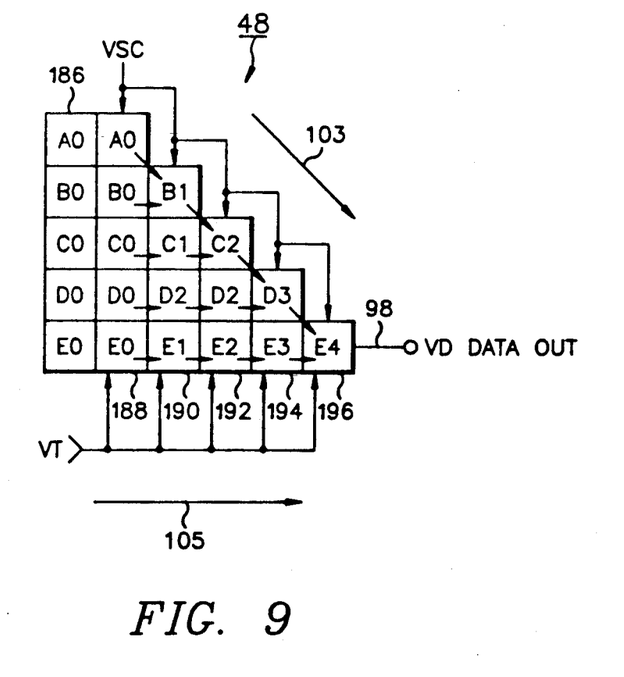
FIG. 9 is a pick-up device structural diagram of another embodiment of the invention.

Referring to FIG. 9, the first line CCD array 188 which is attached to the Hall sensor array 186, stores sensing signal of the Hall sensor array 186, transfers the stored signals in the first direction by the charge transmission clock 17, and shifts to the second direction by the shift clock VSC. An charge transmission shifting unit is, attached to the first direction of the first line CCD array 188, arrayed with gradual decrement of one cell in the second direction, and transmits charge to the first direction by the charge transmission clock VT, and shifts to the second direction beginning with signal earlier recorded among the charge transmission signals which are transmitted in the first direction. Here, the signal earlier recorded refers to the signals recorded earlier than other signals by the helical-scanning recording as described in FIGS. 1 and 2. And the charge transmission clock VT of FIG. 9 is inputted by a unit of one field of image signal and unit a vertical synchronizing signal, and the shift clock VSC has period of the first and the second clocks CLK1, CLK2 as described in FIG. 5, has frequencies two to four times higher than the modulated frequencies.

FIGS. 8 and 9 are the other embodiment according to present invention, in which there are assumed that there are picture elements (pixels) perpendicular on the surface of the optical magnetic tape 28.

The present invention is described with reference to an operation that the signal recorded on the optical magnetic tape is picked up by playback operation of the other embodiment. Herein, when the optical magnetic tape 28 advances towards the arrow direction 43, the Hall sensor array 186 of the pick-up unit 48, which is disposed close to the surface of the optical magnetic tape, senses signals of optical recording pixels A0, B0, C0, D0, E0 of the five helical scanning tracks HST4-HST0. The sensing signal from the Hall sensor array 186 are stored in each cell of the first line CCD array 188. At that time, when the control data (vertical synchronizing signal) recorded on subtrack of the optical magnetic tape 28 is retrieved and produces charge transmission clock VT to be applied to the line CCD arrays 188, 190, 192, 194, and 196, each of the line CCD arrays transfers the stored charge to the first arrow direction 105.

When the shift clock VSC is applied after the charge is transferred by the charge transmission to the next line CCD array, each of the line CCD arrays shifts at high speed the earlier recorded signal to the second arrow direction 103. Here, the shift clock VSC has very high frequency that is two to four times higher than that of the modulated signal. Therefore, the picked-up charge which is sensed in the first direction each field and stored, is transferred to the next CCD array and by the high speed clock shifted to the second direction, thus from the output line 98 helical-scanned recorded signals are generated in the order of E4, D3, C2, B1, A0, which is their recorded sequence from earlier to later. The picking up the control data from the subtrack and generating the transmission clock VT as in the foregoing description can be done by using the above stated circuit of FIG. 5, or the transmission clock VT can be easily obtained by picking up by using Hall sensor and shape-outputting square wave.

By fabricating the optical recording pickup unit as illustrated in FIG. 9, a number of Hall sensors that are difficult to manufacture are reduced and thereby integrating the optical pick-up unit can be made easy.

As in the foregoing descriptions the present invention has such advantage that can simplify the optical system of the data recording system by applying electric signal to a piezo element which is attached to a collecting lens focusing a spot of the beam on the flat recording surface of the optical magnetic tape by means of contraction and expansion of the piezoelement and performing the optical magnetic recording, and by having a fixed pick-up device, which is installed very close to the surface of the optical magnetic tape, picking up and recording the data.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. An optical data recording system for recording image signals which are converted into optical signals on an optical magnetic tape, comprising:
   a first laser generator for generating laser beams according to picture data of the image signals;
   focus control signal generating mans for generating electric signals for controlling focus according to synchronizing signals from said image signals; and
   beam collecting means having a collecting lens and an element that vibrates according to said electric signals, for controlling focus, applied thereto, for vibrating together with said collecting lens according to the vibration of said vibration element, and for focusing said laser beams according to said vibration in order for said laser beam to be focused on said tape after receiving said generated laser beams.

2. An optical data recording system as claimed in claim 1, wherein said vibrating element is a piezo element.

3. An optical data recording system as claimed in claim 2, wherein said first laser generator generates said laser beams in horizontal movement and records collected beams from said beam collecting means on the surface of the optical magnetic tape in upward and downward manner.

4. An optical data recording system as claimed in claim 2, further comprising a polysurface rotary mirror that has at least three reflective surfaces, is located between said beam collecting means and the optical magnetic tape, and diffracts and refracts laser beam of incidence on the surface of said optical magnetic tape corresponding to an angle of incidence according to rotation of said reflective surface, and performing helical recording.

5. An optical data recording system as claimed as in claim, 3, wherein said synchronizing signal is a vertical synchronizing signal and said electric signal for controlling focus is a parabolic voltage.

6. An optical recording data reproduction system for reproducing recorded data of an optical magnetic tape wherein main data is optically recorded on main track surface in the form of helical scan, control data for controlling reading of the main data that is optically recorded on the subtrack placed under said main track, comprising:
   a shift clock input terminal;
   first pick-up means fixedly mounted close to the surface of said optical magnetic tape, for sensing and storing optically magnetic recorded data on said main track, and for generating said stored data by way of shift transmission according to charge transmission clock and the shift clock of said input terminal;
   second pick-up means fixedly mounted close to lower flat surface os said optical magnetic tape, for sensing control data recorded in the subtrack;
   control clock generating means, which are triggered by a sensed control data output of said second pick-up means, for applying the charge transmission clock to the first pick-up means; and
   means for amplifying the output signal of said first pick-up means up to a given level, and for demodulating said amplified signal to produce a digital signal.

7. An optical recording data reproduction system as claimed in claim 6, wherein said first pick-up means comprises:
   a Hall sensor array disposed close to the surface of helical-scanning track of the optical magnetic tape which is magnetically track-recorded by helical scanning, for sensing magnetic recording data;
   a line CCD array, attached to said Hall sensor array, for storing said sensing signal, for transmitting said stored data according to charge transmission clock generated from said control clock generating means, and for clearing the stored charge by clear clock; and
   a shift array for shifting the signal transmitted from said line CCD array, by first and second shift clocks that have different phases from each other.

8. An optical recording data reproduction system as claimed in claim 7, comprising:
   a first pulse generator for generating a first pulse with a first duration, by a control clock signal being triggered by an output of amplifications means that amplifies the sensed control data output of said second pick-up means;
   a second pulse generator for supplying to said first pick-up means with a charge transmission clock which has a second duration, triggered at a downward edge of said first pulse; and
   a third pulse generator for supplying to said first pick-up means with a clear clock which has a third duration, triggered by the output of said second pulse generator.

9. An optical recording data reproduction system as claimed in claim 6, wherein said first pick-up means comprise:
   a Hall sensor array, fixedly disposed vertically close to the surface of the optical magnetic tape which is recorded by helical scanning;
   a first line CCD array, attached to said Hall sensor array, for storing the sensing signal of said Hall sensor array, for transmitting the stored charge to a first direction by means of the charge transmission clock, and for shifting the transmitted charge to a second direction by the shift clock; and
   charge transmission shifting means, attached to the first direction of said first line CCD array, decreased cell by cell to the second direction, for transmitting the charge to the first direction by charge transmission clock, and for shifting to the second direction beginning with signal earlier recorded, among the charge transmission signals which are transmitted to the first direction.

10. An optical data recording system as claimed in claim 4, wherein said synchronizing signal is a vertical synchronizing signal and said electric signal for controlling focus is a parabolic voltage.

11. The optical data recording system as claimed in claim 1, further comprising:
synchronizing signal separating means for separating said synchronizing signals from said image signal.

12. The optical data recording system as claimed in claim 11, further comprising:
a second laser generator for converting said synchronizing signals to a laser beam for recording on a subtrack of said optical magnetic tape as control data.

13. The optical recording data reproduction system as claimed in claim 6, wherein said control clock generating means comprises:
means for amplifying said sensed control data output of said second pick-up means to produce an amplified control data output signal; and
means for clipping the amplified control data output signal.

14. An optical data recording system for recording image signals, which are converted into optical signals, on an optical magnetic tape, comprising:
first laser generating means for generating laser beams according to picture data of the image signals;
synchronous separation means for separating vertical synchronizing signals from said image signals;
means for converting said separated vertical synchronizing signals into parabolic waveform voltages;
means for generating focus control signals in response to said parabolic waveform voltages;
beam collecting means having a collecting lens for focusing said laser beams on said optical magnetic tape, and an element that vibrates in response to said focus control signals for vibrating together with said collecting lens for controlling the focusing of said laser beams on said optical magnetic tape by said collecting lens; and
second laser generating means for converting said vertical synchronizing signals to a laser beam for recording on a subtrack of said optical magnetic tape as control data.

15. An optical data recording system as claimed in claim 14, further comprising a polysurface rotary mirror that has at least three reflective surfaces, is located between said beam collecting means and the optical magnetic tape, and diffracts and refracts laser beam of incidence on the surface of said optical magnetic tape corresponding to an angle of incidence according to rotation of said reflective surface, and performing helical recording.

16. A reproduction system for reproducing recorded data of an optical magnetic tape wherein main data is optically recorded on a main track of said tape in the form of helical scan, and for reproducing control data optically recorded on a subtrack adjacent said main track, wherein said control data controls reading of the main data, said system comprising:
a shift clock input terminal for receiving a shift clock;
first pick-up means, fixedly mounted close to and above the main track of said optical magnetic tape, for sensing and storing said main data recorded on said main track, and for outputting said stored data by way of shift transmissions according to a charge transmission clock and the shift clock of said shift clock input terminal;
second pick-up means, fixedly mounted close to and above said subtrack of said optical magnetic tape, for sensing said control data recorded on the subtrack;
control clock generating means, triggered by the sensed control data of said second pick-up means, for applying the charge transmission clock to the first pick-up means; and
means for amplifying an output signal of said first pick-up means up to a given level, and for demodulating said amplified signal to produce a digital signal.

17. A reproduction system as claimed in claim 16, wherein said first pick-up mean comprises:
a Hall sensor array disposed close to and above the main track of the optical magnetic tape for sensing said main data;
a line CCD array, attached to said Hall sensor array, for storing said sensed main data, for transmitting said stored main data according to the charge transmission clock generating from said control clock generating means, and for clearing a stored charge by a clear clock; and
shift array means for shifting the data transmitted from said line CCD array, by first and second shift clocks that have different phases from each other.

18. A reproduction system as claimed in claim 17, comprising:
means for amplifying the sensed control data and for clipping the amplified control data of said second pick-up means;
means triggered by said clipped control data for generating a control clock signal;
a first pulse generator for generating a first pulse with a first duration in response to said control clock signal being triggered by said clipped control data;
a second pulse generator, triggered at a falling edge of said first pulse, for supplying said charge transmission clock, which has a second duration, to said first pick-up means; and
a third pulse generator, triggered by the output of said second pulse generator, for supplying said clear clock, which has a third duration, to said first pick-up means.

19. An optical data recording method for recording image signals, which are converted into optical signals, on an optical magnetic tape, comprising the steps of:
generating laser beams according to picture data of the image signals;
separating vertical synchronizing signals from said image signals;
converting said separated vertical synchronizing signals into parabolic waveform voltages;
generating focus control signals in response to said parabolic waveform voltages;
focusing said laser beams on said optical magnetic tape, by utilizing beam collecting means having a collecting lens and an element that vibrates in response to said focus control signals to vibrate said collecting lens to control the focusing of said laser beams on said optical magnetic tape by said collecting lens; and converting said vertical synchronizing signals to a laser beam for recording on a subtrack of said optical magnetic tape as control data.

20. The optical data recording method as claimed in claim 19, further comprising the steps of:

diffracting and refracting laser beam of incidence on the surface of said optical magnetic tape corresponding to an angle of incidence according to rotation of said reflective surface, and performing helical recording by utilizing a polysurface rotary mirror that has at least three reflective surfaces which is located between said beam collecting means and the optical magnetic tape.

21. A method for reproducing recorded data of an optical magnetic tape wherein main data is optically recorded on a main track of said tape in the form of helical scan, and for reproducing control data optically recorded on a subtrack adjacent said main track, wherein said control data controls reading of the main data, said method comprising the steps of:

receiving a shift clock at a shift clock input terminal;

sensing and storing said main data recorded on said main track by utilizing first pick-up means, fixedly mounted close to and above the main track of said optical magnetic tape;

outputting said stored data by way of shift transmissions according to a charge transmission clock and the shift clock of said shift clock input terminal;

sensing said control data recorded on the subtrack by utilizing second pick-up means, fixedly mounted close to and above said subtrack of said optical magnetic tape;

generating the charge transmission clock in response to the sensed control data of said second pick-up means;

applying the charge transmission clock to the first pick-up means;

amplifying an output signal of said first pick-up means up to a given level; and demodulating said amplified signal to produce a digital signal.

22. The reproduction method as claimed in claim 21, further comprising the steps of:

amplifying the sensed control data;

clipping the amplified control data;

generating a control clock signal in response to said clipped control data;

generating a first pulse with a first duration in response to said control clock signal being triggered by said clipped control data;

supplying said charge transmission clock, which has a second duration, in response to a falling edge of said first pulse to said first pick-up means; and supplying said clear clock, which has a third duration, to said first pick-up means in response to said charge transmission clock.

* * * * *

UNITED STATES PATENT AND TRADEMARK OFFICE
CERTIFICATE OF CORRECTION

PATENT NO.  : 5,140,566
DATED       : 18 August 1992
INVENTOR(S) : Jin-Ku KANG, et al.

It is certified that error appears in the above-identified patent and that said Letters Patent is hereby corrected as shown below:

Claim 1,    Column 9,    Line 29,    Change "mans" to --means--.

Claim 5,    Column 9,    Line 60,    Delete the comma "," after "claim".

Claim 6,    Column 10,   Line 12     Change "os" to --of--.

Signed and Sealed this

Twelfth Day of October, 1993

Attest:

Attesting Officer

BRUCE LEHMAN

Commissioner of Patents and Trademarks